(12) United States Patent
Giorio et al.

(10) Patent No.: US 10,779,419 B2
(45) Date of Patent: Sep. 15, 2020

(54) WALL APPARATUS FOR CONTROLLING UTILITIES

(71) Applicant: INTEREL PTE LTD

(72) Inventors: Marco Giorio, Negrar (IT); Riccardo Maestri, Dubai (AE); Andrea Benoni, Cavaion Veronese (IT); Philip Santa, Monte San Pietro (IT)

( * ) Notice: Subject to any disclaimer, the term of this patent is extended or adjusted under 35 U.S.C. 154(b) by 0 days.

(21) Appl. No.: 16/387,272

(22) Filed: Apr. 17, 2019

(65) Prior Publication Data
US 2019/0320538 A1 Oct. 17, 2019

(51) Int. Cl.
*H02B 1/01* (2006.01)
*H05K 5/00* (2006.01)
*H02G 3/12* (2006.01)
*H05K 5/02* (2006.01)

(52) U.S. Cl.
CPC .......... *H05K 5/0017* (2013.01); *H02G 3/121* (2013.01); *H05K 5/0204* (2013.01)

(58) Field of Classification Search
USPC ........................................................ 361/728
See application file for complete search history.

(56) References Cited

U.S. PATENT DOCUMENTS

| 6,888,441 | B2* | 5/2005 | Carey | H01H 37/043 337/304 |
| 8,802,981 | B2* | 8/2014 | Wallaert | F24F 11/00 174/58 |
| 9,989,273 | B2* | 6/2018 | Read | F24F 11/89 |
| 2016/0020590 | A1* | 1/2016 | Roosli | H02G 3/081 361/679.31 |

* cited by examiner

*Primary Examiner* — Hung S. Bui
(74) *Attorney, Agent, or Firm* — Seyfarth Shaw LLP

(57) ABSTRACT

A wall apparatus (1) for controlling utilities that can be installed at an internal cavity (2) of the wall itself in which the electrical connection cables to said utilities are present, wherein said apparatus (1) comprises a wall support frame (6) superposable on an access mouth of said cavity (2) and comprising a fixing means (8) to said cavity (2), and an electronic device (5) for displaying graphical symbols mounted on the support frame (6). In particular, the fixing means (8) of said support frame (6) is configured to fix said frame in at least two different fixing positions and displaced with respect to said cavity (2) so that the surface dimensions of said electronic device (5), mounted on said support frame, cover said mouth according to the shape and size of said cavity (2).

20 Claims, 9 Drawing Sheets

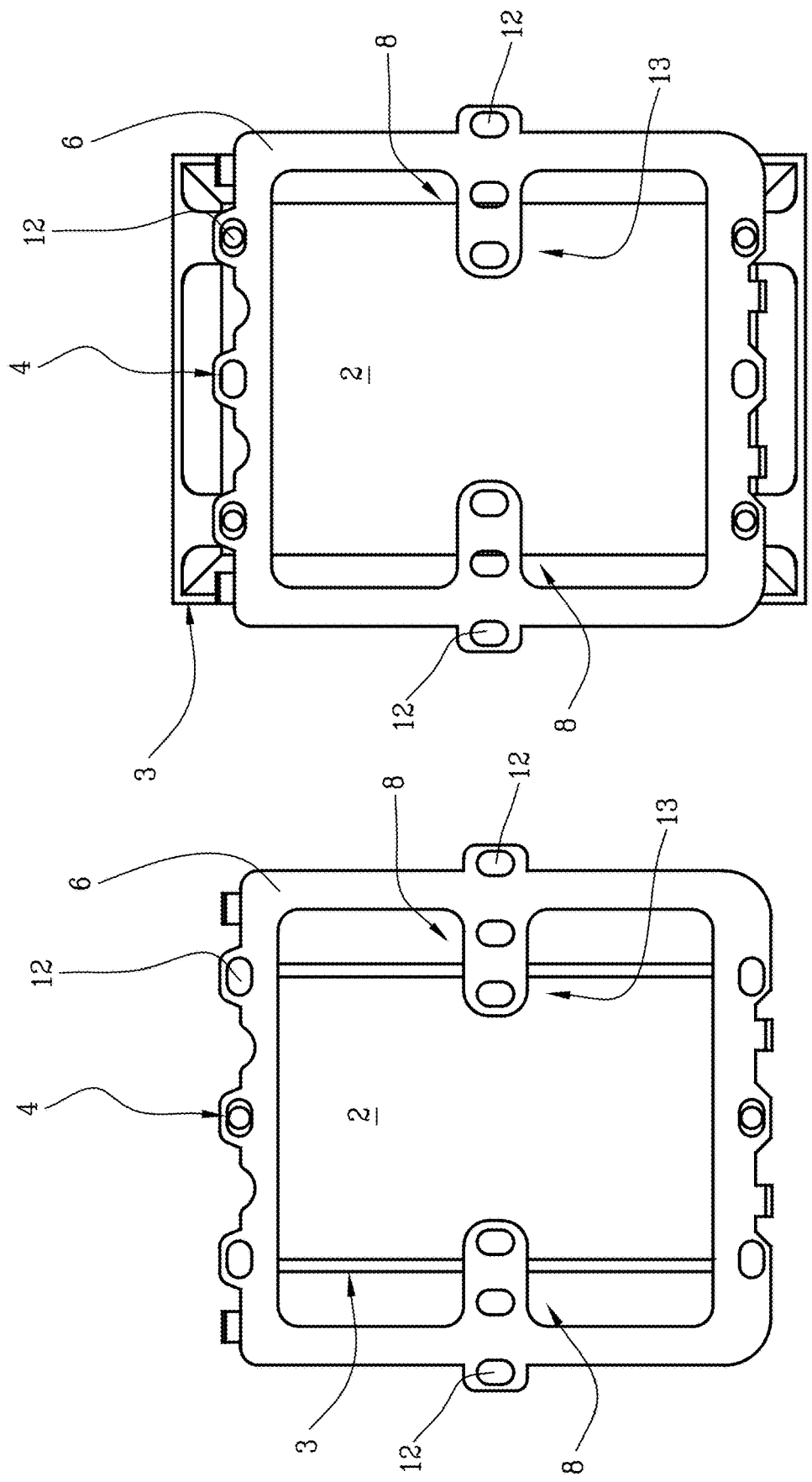

WALL APPARATUS FOR CONTROLLING UTILITIES

FIELD OF APPLICATION

The present invention relates to a wall apparatus for controlling utilities that can be installed at a wall box inserted in an internal cavity of the wall itself in which the electrical connection cables to said utilities are present.

In particular, such apparatus is preferably used for management systems of the utilities present in a hotel room, at home or also in the domotics sector. Preferably, said apparatus is usually connected to various utilities in the home or in a hotel room or the like (heating, air conditioning, lights, etc. . . . ) and allows the status of such utilities to be displayed, through a screen that is preferably of the touch-screen type, as well as to manage them.

STATE OF THE ART

A wall control apparatus is normally installed at a cavity afforded (hollowed) on a vertical wall, e.g. of a room. Preferably, inside such cavity, there is a pre-inserted wall box in which the electrical cable terminals are conveyed that allow the utilities to be controlled.

Precisely, the control apparatus is fixed to the wall and in part fits inside the wall box for the containment of various electronic devices.

An example of such prior art is described in document WO 2012/156871, in the name of the same Applicant, which illustrates a control apparatus having a containment compartment that fits inside the wall box, and a perimeter zone that exits from the box for overlapping with the wall. In this way, the apparatus has a sort of surface extension outside the wall box for obtaining a larger screen. The particular lighting technique described in such document also allowed the surface extension of the screen to be exploited in the perimeter zone so as to have more space for projecting the icons onto the screen.

However, this known technique has some drawbacks.

In particular, the containment compartment that fits into the wall box limits the possibilities to adapt the apparatus to the different types of wall boxes that are otherwise realized according to the country (e.g. Italy, Germany, USA), as the apparatus is not translatable along the wall plane.

It is also to be noted that the different types of wall boxes that are currently widespread have connecting holes arranged in known positions but issued by different bodies and only in some cases concordant or in similar positions, therefore the apparatus is often not directly connectible except through adaptor jigs to be interposed. In fact, in addition to the above disclosure of the attachment points, the depth and dimension of the box also play a decisive role as they exclude a priori the use of products whose depth or width exceed those of the box itself without resorting to adaptor jigs.

OBJECT OF THE INVENTION

In this situation the object of the present invention is to realize an apparatus for controlling utilities that can be adapted to any size of cavity or box present in the wall.

Furthermore, a further object of the present invention is to realize an apparatus for controlling utilities that fully covers the access mouth of the cavity or box present in the wall regardless of the dimensions of the latter.

The above-indicated objects are substantially attained by an apparatus for controlling utilities according to what is described in the appended claims.

BRIEF DESCRIPTION OF THE FIGURES

Further characteristics and the advantages of the present invention will appear more clearly from the detailed description of some preferred, but not exclusive, embodiments of an apparatus for controlling utilities illustrated in the appended drawings, wherein:

FIGS. 7a, 7b, 7c, 7d show a front view of the support frame of the apparatus installed on different types of wall boxes.

DETAILED DESCRIPTION OF AT LEAST ONE PREFERRED EMBODIMENT OF THE INVENTION

Figure 1:
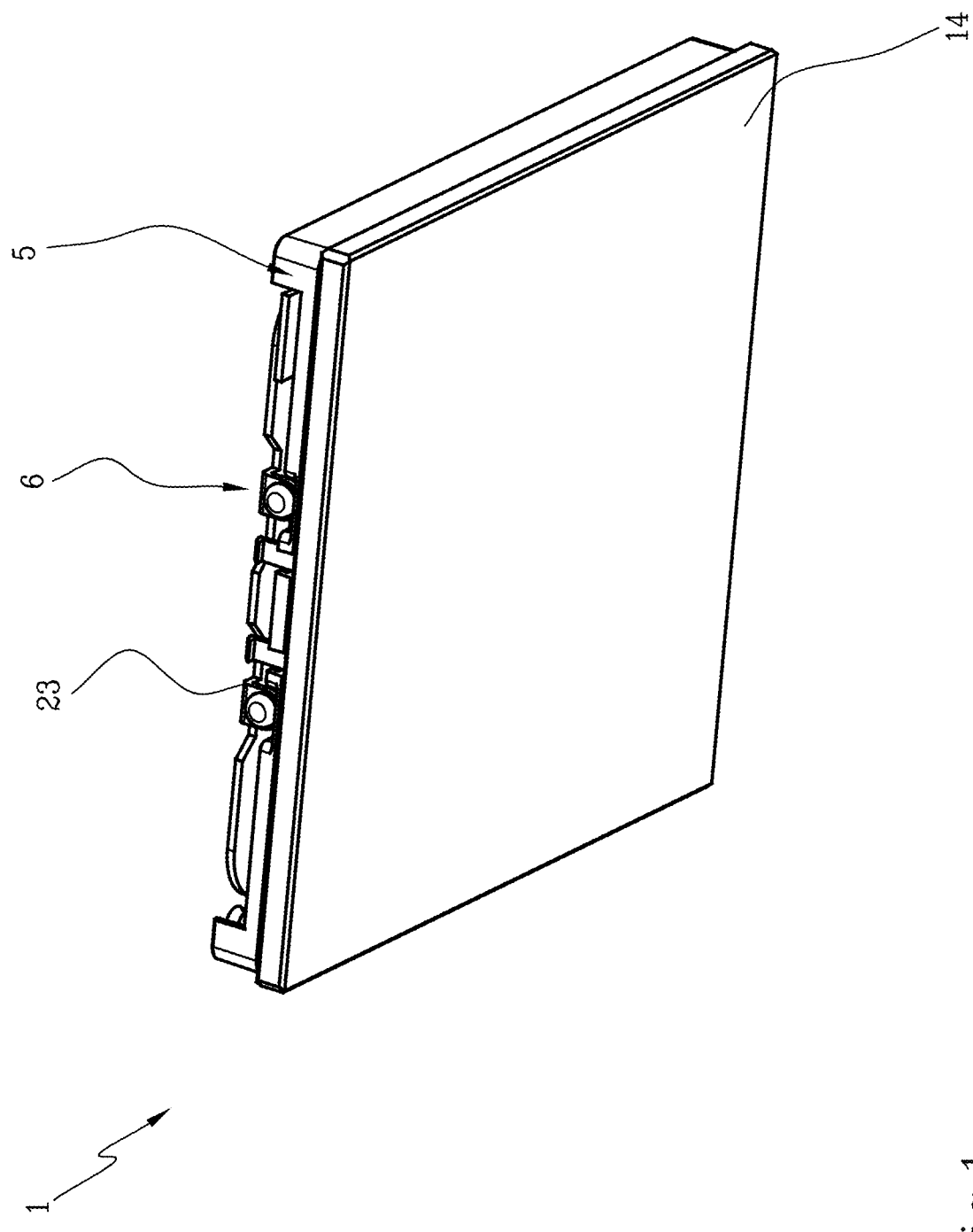
FIG. 1 shows a front axonometric view of an apparatus according to the present invention.
Figure 2:
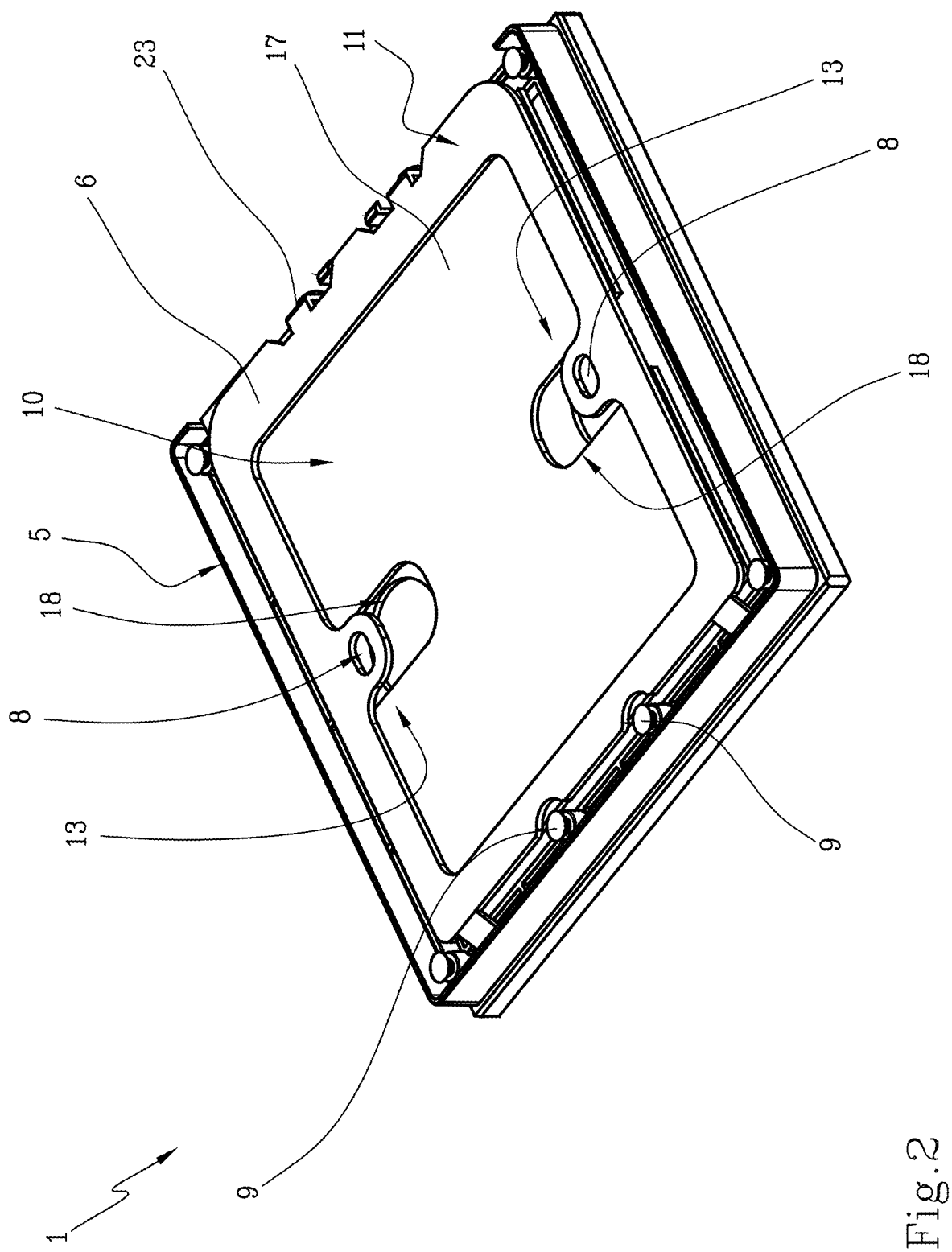
FIG. 2 shows a rear axonometric view of the apparatus of FIG. 1.

With reference to the cited figures, reference numeral 1 denotes in its entirety an apparatus for controlling utilities according to the present invention.

As already mentioned, the apparatus 1 for controlling utilities is of the type that can be installed on a wall at an internal cavity 2 of the wall itself in which the electrical connection cables to such utilities are present.

It is to be noted that the present invention extends to two types of installation: the first envisages the apparatus 1 being installed directly at a cavity 2 afforded in the wall, while the second envisages the apparatus 1 being installed on the wall box 3 that is present inside the cavity 2. In particular, in this latter case, the wall box 3 usually has connection points 4 (holes) for the apparatus 1.

Figure 7D:
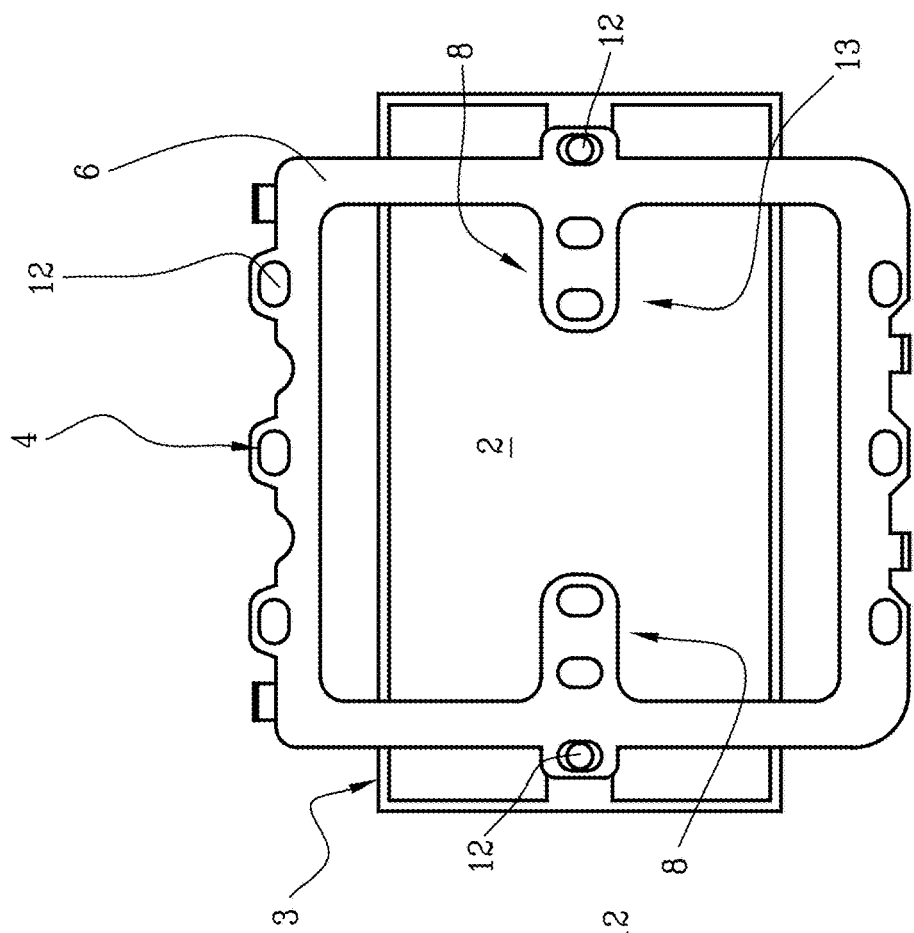
Figure 7C:
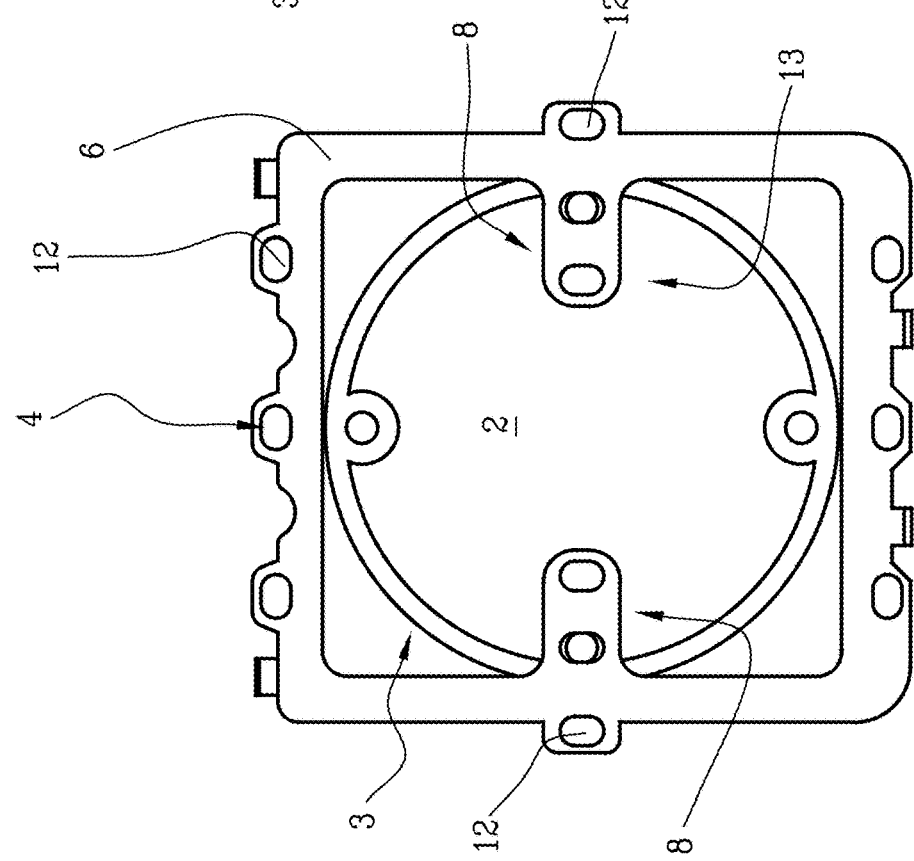
Figure 8:
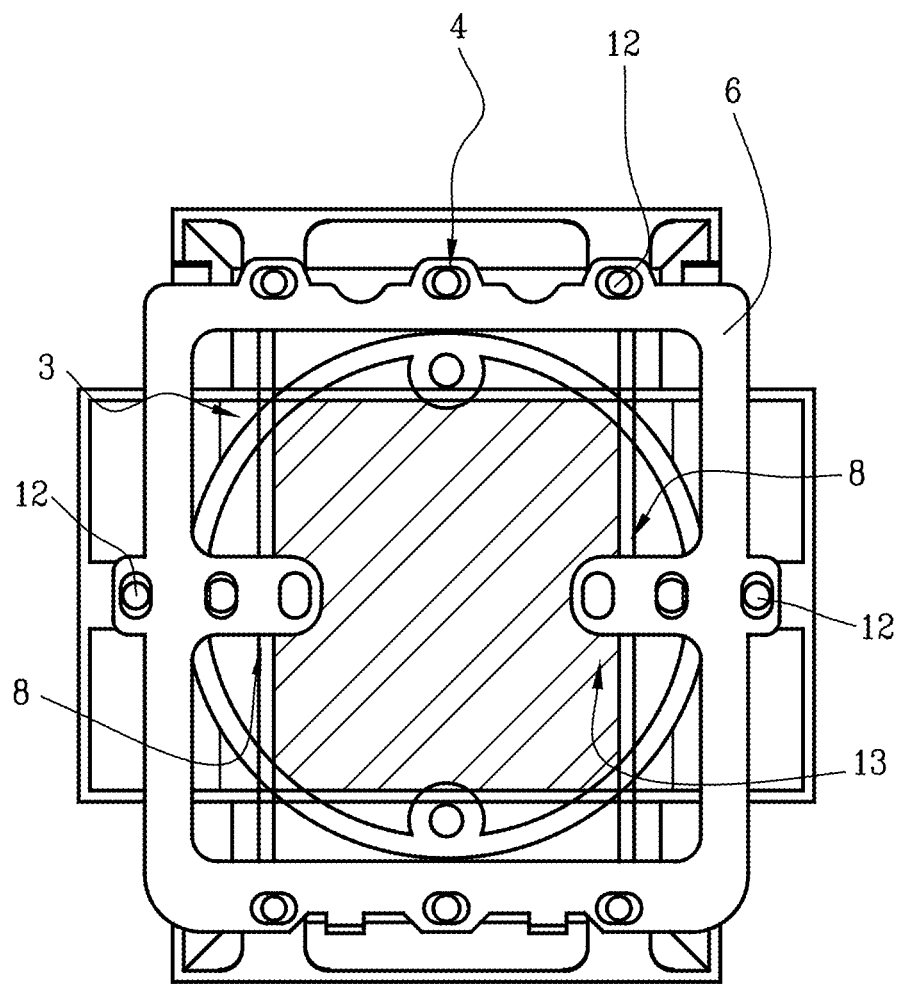
FIG. 8 shows a superposition figure of the support frame with respect to the different types of wall boxes.

As represented in FIGS. 7a, 7b, 7c, 7d and as better disclosed below, there are different types of wall boxes on the market having different sizes and formats. FIGS. 7a, 7b represent respective boxes 3 of the USA type (single and double), FIG. 7c represents a box 3 of the German type, while FIG. 7d represents a box 3 of the Italian type.

In any case, the apparatus 1 according to the present invention comprises a wall support 6 that can be superposed with an access mouth of said cavity 2 and comprising a fixing means 8 to said cavity 2 or to the wall box 3.

Preferably, the support 6 is shaped like a frame and reference will mainly be made below to a support frame 6 only by way of example and without excluding the fact that such support 6 could be realized according to different forms from those of the frame.

In particular, such support 6 has a through opening 7 for realizing a connection from and to said electrical cables.

Preferably, such opening 7 is central and has an enlarged extension so as to allow the exit of the cables still inside the box 3.

Furthermore, the apparatus 1 comprises an electronic display device 5 for displaying graphical symbols and mounted on the support frame 6 through a reversible connection means 9. Such display device 5 is in communication with said cavity 2 through said through opening in which, in use, the electrical cables are arranged. In other words, the electrical cables are connected from the display device 5 to the electrical terminals present in the cavity 2 passing through the opening in the frame.

According to the present invention, the electronic device 5 extends completely outside the wall cavity 2 or box 3. In other words, the electronic device 5 does not have any portions that fit into the wall cavity 2 or box 3.

Preferably, the rear surface 10 of the electronic display device 5 is substantially flat.

Preferably, the rear surface 11 of the support frame 6 is substantially flat so that it can be freely displaced with respect to the cavity 2 or to the box 3.

Advantageously, the dimensions of the central opening 7 are such as to allow the cables to pass through the frame 6 in more or less de-centered positions with respect to it so as to fit into all the possible combinations of dimensions and offset of the frame 6 with respect to the wall box 3.

Furthermore, advantageously, the apparatus 1 comprises only two single bodies or components, one of which is defined by the support frame 6 and the other by the electronic device 5.

Furthermore, according to the present invention, the electronic device 5 has a surface dimension according to an installation plane parallel to the wall such as to completely cover said access mouth to the cavity 2 or to the box 3.

Preferably, the electronic display device 5 has surface dimensions greater than or equal to the surface dimensions of the support frame.

Figure 3A:
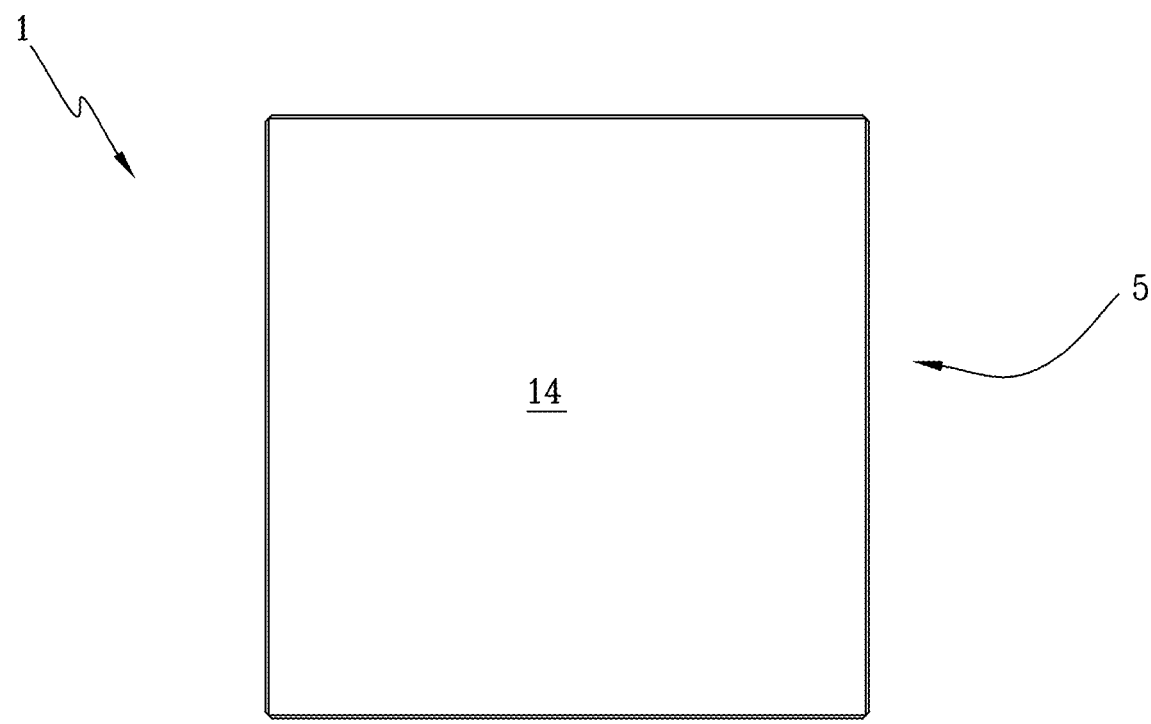
FIGS. 3a, 3b, 3c show views from the front, bottom and rear, respectively, of a first embodiment of the apparatus according to the present invention.
Figure 3B:
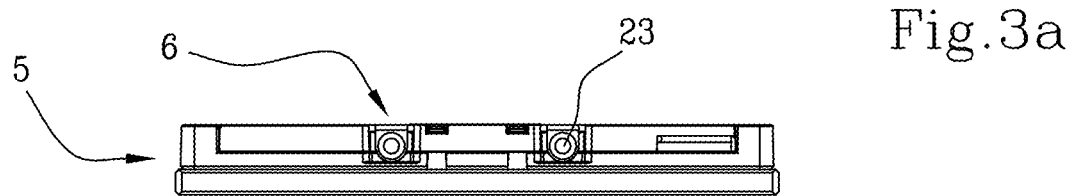
Figure 3C:
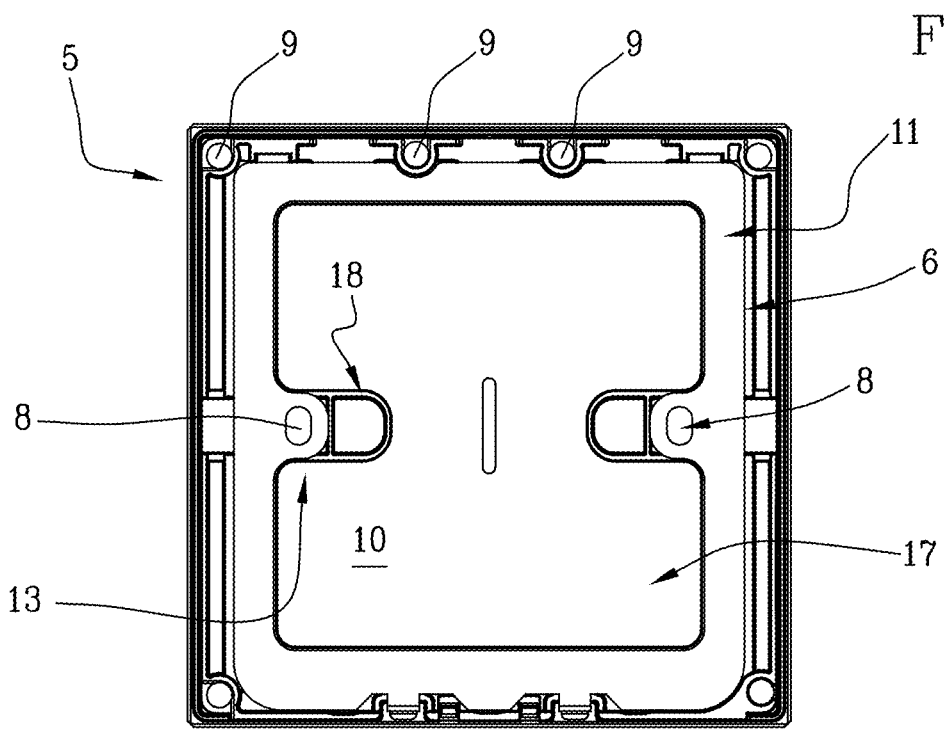

For example, in a first embodiment illustrated in FIGS. 3a, 3b, 3c, the electronic display device 5 has surface dimensions substantially equal to the surface dimensions of the support frame.

Figure 4A:
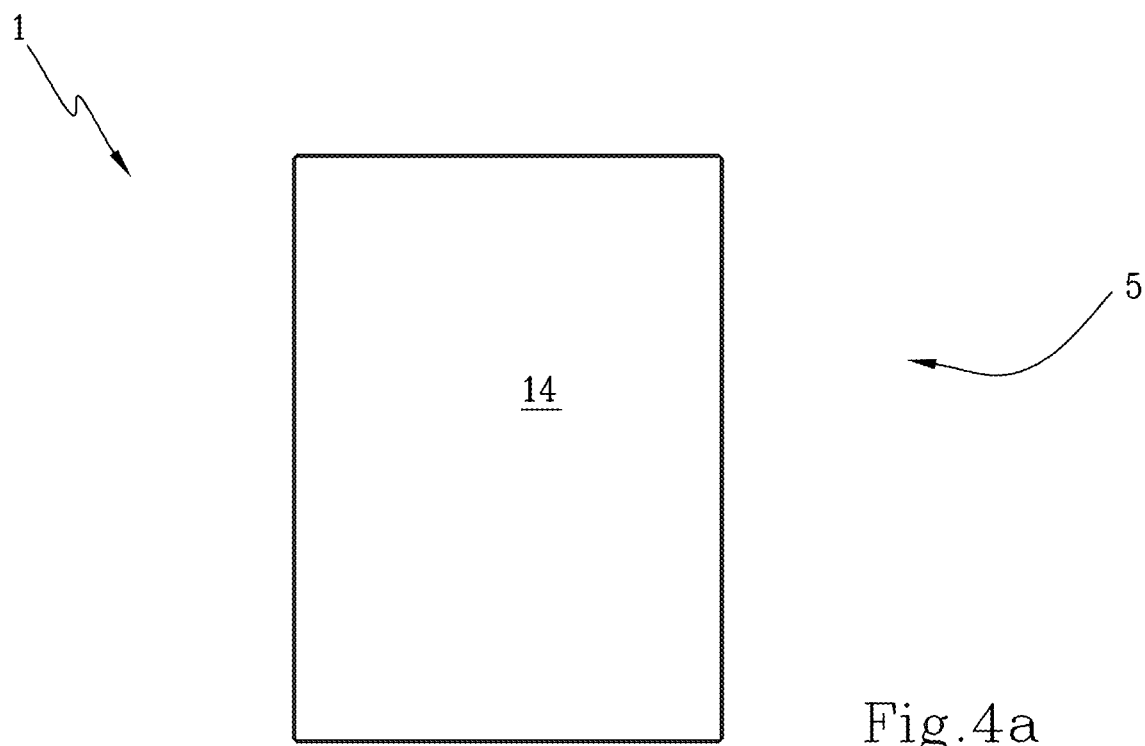
FIGS. 4a, 4b, 4c show views from the front, bottom and rear, respectively, of a second embodiment of the apparatus according to the present invention.
Figure 4B:
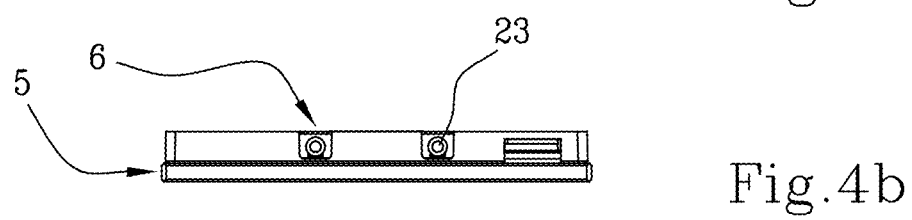
Figure 4C:
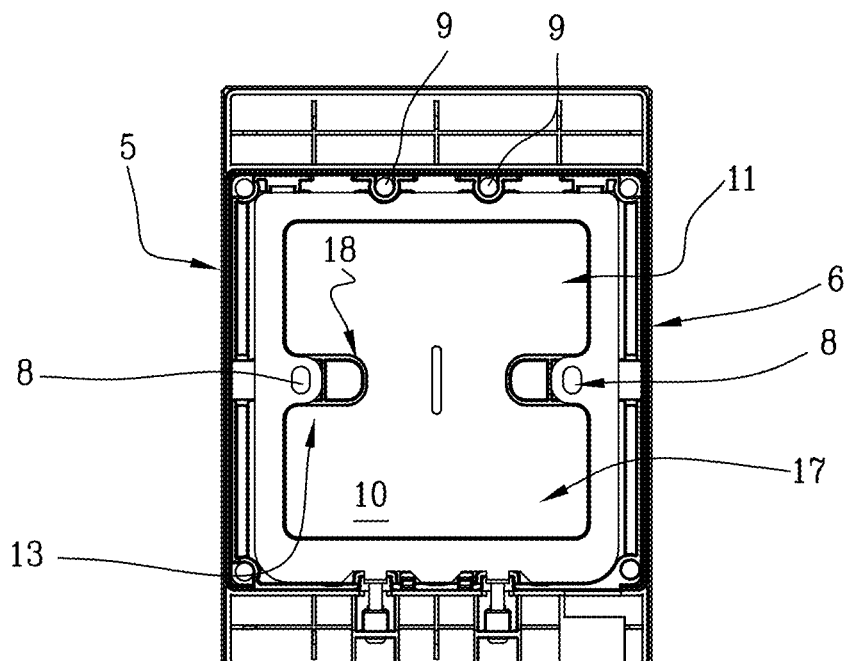

In a second embodiment illustrated in FIGS. 4a, 4b, 4c, the electronic display device 5 has surface dimensions greater than the surface dimensions of the support frame 6 at only two opposite sides of the support frame.

Figure 5A:
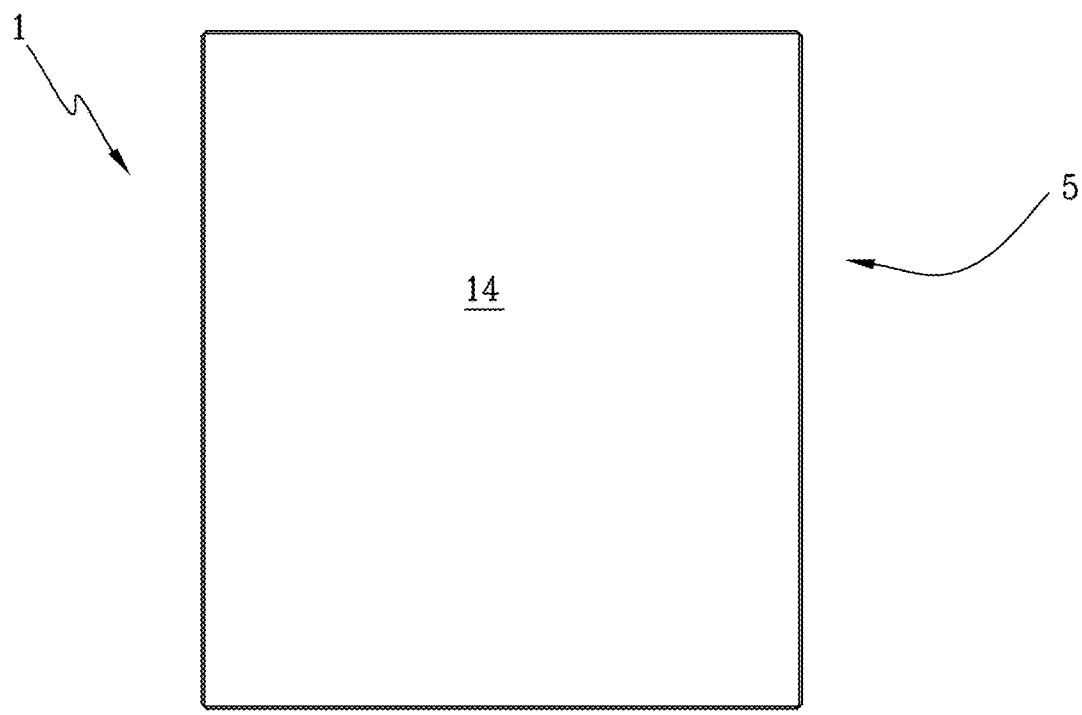
FIGS. 5a, 5b, 5c show views from the front, bottom and rear, respectively, of a third embodiment of the apparatus according to the present invention.
Figure 5B:
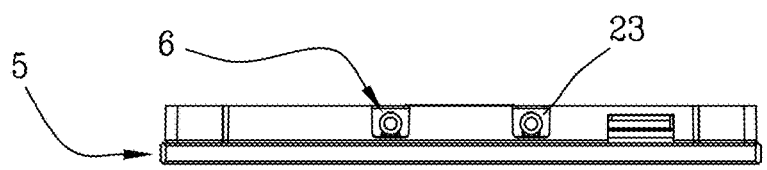
Figure 5C:
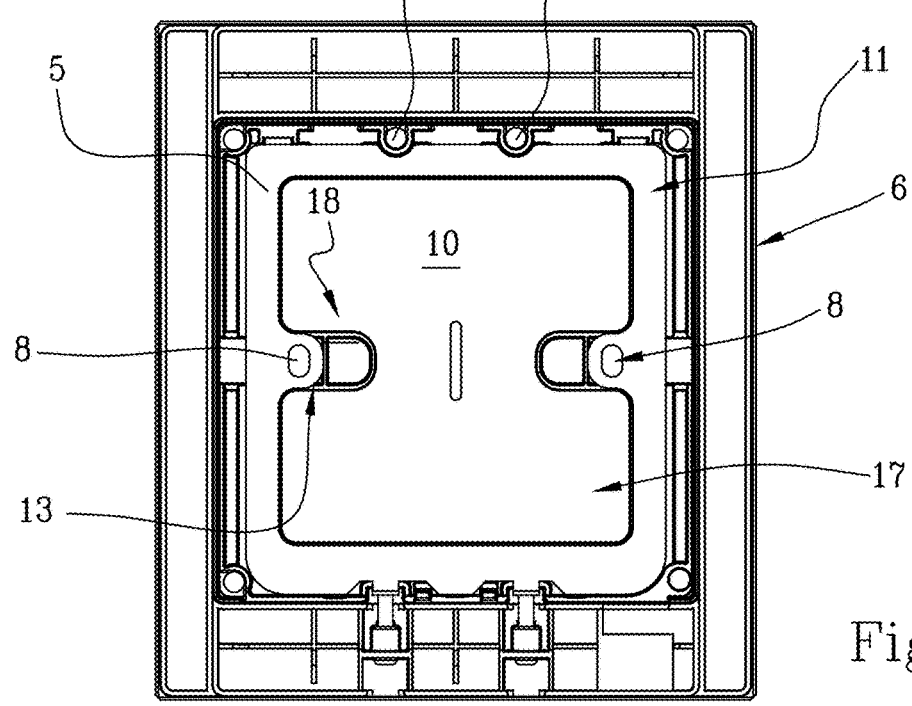
Figure 6:
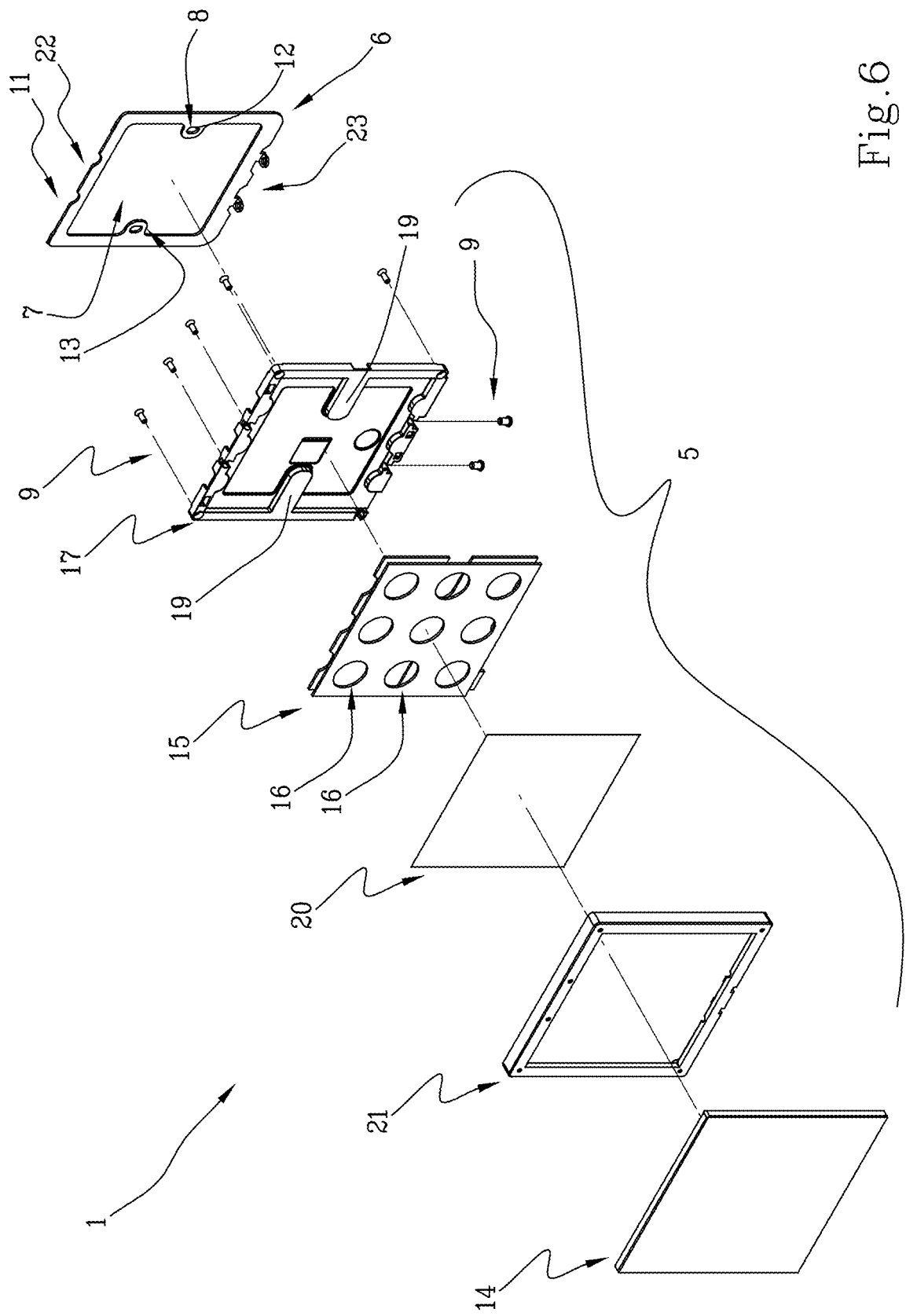
FIG. 6 shows an exploded front axonometric view of the display device of FIG. 1.

In a third embodiment illustrated in FIGS. 5a, 5b, 5c, the electronic display device 5 has surface dimensions greater than the surface dimensions of the support frame 6 at all of the sides defining the support frame.

According to an aspect of the present invention, the fixing means 8 of the support frame 6 is configured to fix the frame in at least two different fixing positions and displaced with respect to the cavity 2 or to the box 3 so that the surface dimensions of the electronic device 5, mounted on said support frame, entirely cover the access mouth according to the shape and size of said cavity 2.

In this way, the support frame 6 can be displaced along the plane of the wall so as to be able to adapt it to the type of cavity 2 or box 3 to which it is to be fixed.

In particular, the fixing means 8 for fixing the support frame 6 has a plurality of fixing members 12 distributed along said frame in different points so as to define said fixing positions.

Preferably, such fixing members 12 are split at least into pairs wherein each pair comprises fixing members 12 arranged in homologous and opposite positions on said support frame. For example, a first fixing pair can comprise fixing members 12 arranged centrally on an upper side of the frame and on a lower side of the same frame (FIG. 7a).

With reference to FIG. 7b, a larger box 3 (called "double gang") has been shown, typical of the USA market wherein the electronic display device 5 has surface dimensions greater than the surface dimensions of the support frame 6 at all the sides defining the support frame so as to cover such box 3.

Advantageously, such embodiment allows any aesthetically undesirable portions of the wall to be covered with only one cable exit (small 1 inch hole) and/or the aforesaid "double gang" to be covered using as a fixing means 8 the holes outside the frame 6 (above and below).

Preferably, the distance between the adjacent fixing members 12 of different pairs is connected to at least two different standards of access mouth to the cavity 2. Preferably, the distance between adjacent fixing members 12 of different pairs is connected with at least two different standards of box 3 so that the fixing members 12 are both at a first standard of box 3 and a second standard of box 3 different from the first.

Even more preferably, the distance between the adjacent fixing members 12 of different pairs is a multiple or sub-multiple of a dimension of the access mouth to the cavity 2 or of the box 3.

In other words, the position of at least a first fixing member 12 is related to the fixing position to a first standard of box 3 so that the electronic device 5 fully covers the respective cavity 2 when fixed; and the position of at least a second fixing member 12, different from the first, is related to the fixing position at a different second standard of box 3 so that the electronic device 5 fully covers the respective cavity 2 when fixed.

Some examples of standards of boxes 3 are represented in FIG. 7 wherein:

FIG. 7a represents a first standard typical of the USA ("single gang");

FIG. 7b represents a first standard typical of the USA ("double gang");

FIG. 7c represents a standard typical of Germany;

FIG. 7d represents a standard typical of Italy.

In this way it is advantageously possible to adapt the frame to most boxes on the market.

Preferably, each fixing member comprises a hole and screws are used for the fixing.

In the embodiment illustrated in the appended figures the support frame 6 is of the quadrangular type and has fixing members 12 distributed at least along two opposite sides with respect to the central opening 7.

Furthermore, the support frame 6 has at least two appendages 13 that extend in a cantilever fashion starting from respective opposite sides towards the central opening 7. Preferably the appendages 13 are arranged centrally with respect to an orthogonal plane passing through the frame.

The fixing members 12 are in part arranged on said appendages 13 (preferably there are two holes each side, of which one is a more external one and the other a more internal one with respect to the opening).

Furthermore, the electronic display device 5 comprises a display screen 14 facing the outside and an electronic card 15 arranged behind the screen 14 towards the support frame 6 to be electrically connected to the electrical cables of the internal cavity 2. Such screen 14 preferably comprises a glass panel. Such glass panel defines the maximum dimension of the electronic display device 5.

In the preferred embodiments illustrated in the appended figures, the electronic card 15 comprises a plurality of lighting areas 16 configured for back-lighting different portions of the screen 14. The screen 14 has in turn predefined screen printed icons arranged at said lighting areas 16 so as to be able to be illuminated and visible from the outside.

Preferably, the lighting areas 16 comprise a plurality of lighting elements (preferably LEDs) connected to the card 15 and distributed around each respective lighting area.

Each lighting area can be defined by a corresponding hole on the card 15 or not. In FIG. 4 it is possible to see that the lighting areas 16 are defined by respective holes afforded on the electronic card 15. Preferably, the lighting devices are arranged on a rear surface of the electronic card 15 opposite the front surface facing the screen 14 and there may optionally be reflecting covers for the light arranged to the rear of the lighting devices.

Alternatively, the lighting devices are arranged on the front surface of the card 15.

Furthermore, the front surface of the card 15 advantageously abuts against the screen 14 so as to reduce the thickness dimensions of the electronic display device 5.

It is to be considered that the thickness of the electronic display device 5 is preferably less than 15 millimeters (preferably the thickness is equal to 11 millimeters).

In addition to the system of lighting areas 16, the electronic display device 5 comprises a screen 14 that is displaced with respect to the position of the lighting areas 16. In detail, such screen 14 could be an LCD, LED, OLED or other screen not expressly mentioned herein.

In any case, it is to be noted that the screen 14 and/or the card 15 comprise a touch selection means for receiving a touch command from an external user that touches the screen 14.

Furthermore, in the figure it is possible to see that the electronic display device 5 also comprises a support panel 17 for supporting the electronic card 15 arranged to the rear of the card 15 itself and adapted to be connected to the frame.

Such support panel 17 has its own rear surface at least partly counter-shaped to the support frame. In particular, such rear surface has recesses 18 at the appendages 13 of the support frame.

Such recesses 18 project from a front surface of the support panel 17 and are inserted in respective seats 19 afforded on the rear surface of the card 15.

In other words, the electronic display device 5 has a "sandwich" but joined structure. The joining of such structure is performed through holes and screws that are inserted through the support panel 17 towards the screen 14. Preferably, such screws are screwed into an outer frame 21 arranged to the rear of the screen 14. The screen 14 is then preferably glued to such outer frame 21.

Between the screen 14 and the card 15 there may be a light diffusing layer 20.

Furthermore, with reference to the reversible connection means 9 arranged between the electronic display device 5 and the frame, it comprises members 22 for hanging the electronic display device 5 on the support frame 6 and fixing elements 23. Such hanging members 22 comprise tabs that extend vertically from the frame upwards and holes afforded to the rear of the display device 5. The fixing elements 23 preferably comprise screws that extend through the thickness dimension of the electronic display device 5 so as to operate orthogonal fixing.

Preferably, the hanging members 22 are arranged at an upper side of the support frame 6 opposite a lower side at which the fixing elements 23 are arranged.

The subject matter of the present invention is also a wall kit comprising the apparatus 1 described above and the wall box 3 inserted inside said cavity 2. In particular, the wall box 3 comprises members for connection to the frame and the fixing means 8 for fixing the support frame 6 is advantageously arranged at said connecting members for fixing the support frame 6 to the wall box 3.

Finally, the subject matter of the present invention is a method for installing the apparatus 1 for controlling utilities wherein said method descends directly from what has been described above which is fully recalled below.

The method comprises the steps of:
providing the wall support frame 6;
superposing the support frame 6 with the access mouth of said cavity 2;
fixing the support frame 6 to the cavity 2 through the fixing means 8;
providing the electronic display device 5 for displaying graphical symbols and mounting it on the support frame 6 through the reversible connection means 9 so that said electronic device 5 extends completely outside the cavity 2.

In particular, the step of providing the support frame 6 envisages that the fixing means 8 of said support frame 6 is configured for fixing said frame in at least two different fixing positions and displaced with respect to said cavity 2 or to the box. The step of superposing the support frame 6 with the cavity 2 envisages displacing the frame with respect to the cavity 2 or to the box 3 so that the surface dimension of said electronic device 5, after being mounted on said support frame, covers the mouth according to the shape and dimensions of the cavity 2 or of the box 3. Furthermore, the step of fixing the support frame 6 to the cavity 2 envisages using the fixing position corresponding to the superposition position of the support frame 6 on the cavity 2.

In particular, the step of mounting the display device 5 on the support frame 6 envisages hanging the display device 5 on one side of the support frame 6 through the hanging members 22 and fixing the display device 5 at an opposite side to the first of the support frame.

The present invention attains the set objects.

A first advantage is connected with the positioning versatility of the apparatus with respect to the cavity 2 and to the different types of wall boxes.

In particular, the packing of the apparatus 1 during the installation step not only guarantees protection and ensures rigidity for the product itself but, in light of the geometric optimization and the arrangement of the fixing members 12, allows the use and movement of the frame.

The displacement of the frame is also assisted by the exit position of the electrical cables and the possibility to avoid connectors, which is a very important characteristic in the event of pairing with other similar modules (the cable can also exit laterally).

Furthermore, the independence of the box 3 finds its declination both in bypassing problems related to the variation in depth of wall boxes (discriminating element for mounting in some cases) and in the possibility of the direct application on the wall i.e. only in the presence of a hole to house the cables. In addition, the possibility of offsetting the box makes it possible to tackle external impediments on the wall such as other modules, doors, architectural details, etc.

Furthermore, the apparatus 1 allows the box 3 and/or the portion of technical wall (therefore often not painted) to be hidden, as it is completely external while maintaining overall reduced thicknesses.

Furthermore, in terms of maintenance, the apparatus 1 is completely dismountable as the display device 5 can be removed from the support frame 6 through the lower screws and the display device 5 can also be opened through the rear screws to the support frame 17.

Additionally, the dimensions of the central opening advantageously allow the cables to pass through the frame in all the possible combinations of dimensions and offset of the frame with respect to the wall box.

What is claimed is:

1. An apparatus for controlling utilities that can be installed at an internal cavity of the wall itself in which the electrical connection cables to said utilities are present, wherein said apparatus comprises:
   a wall support superposable on an access mouth of said cavity and comprising a fixing means to said cavity; said support having a through opening for realizing a connection from and to said electrical cables;
   an electronic device for displaying graphical symbols mounted on the support by means of a reversible connection means; said display device being in communication with said cavity by means of said through opening in which the electrical cables are arranged in use;
   wherein said electronic device extends completely outside the cavity of the wall according to an installation plane parallel to the wall; and in that said electronic device has surface dimensions according to said installation plane such as to completely cover said access mouth to the cavity; said fixing means of said support being configured to fix said support in at least two different fixing positions and displaced with respect to said cavity so that the surface dimensions of said electronic device, mounted on said support, cover said mouth according to the shape and size of said cavity; said electronic display device comprising a display screen facing the outside and having a surface area such as to define an outer perimeter edge of the apparatus; and
   wherein the apparatus comprises an electronic card arranged behind the screen towards the support to be electrically connected to the electrical cables of the internal cavity; said electronic card comprising a plurality of lighting areas configured for back-lighting different portions of the screen; a front surface of the card abuts against the screen so as to reduce the thickness dimensions of the electronic display device.

2. The apparatus according to claim 1, wherein there are no fixing frames adapted to limit the surface area of the screen at the perimeter edge.

3. The apparatus according to claim 1, wherein said fixing means for fixing the support has a plurality of fixing members distributed along said support in different points so as to define said fixing positions.

4. The apparatus according to claim 3, wherein said fixing members are divided at least into pairs wherein each pair comprises fixing members arranged in homologous and opposite positions on said support.

5. The apparatus according to claim 4, wherein the distance between the adjacent fixing members of different pairs is connected to at least two different standards of access mouth to the cavity.

6. The apparatus according to claim 3, wherein each fixing member comprises a hole.

7. The apparatus according to claim 3, wherein said support is shaped like a frame extending around said opening.

8. The apparatus according to claim 3, wherein said support is of the quadrangular type and has fixing members distributed along two opposite sides with respect to the opening.

9. The apparatus according to claim 3, wherein said support has at least two appendages that extend in a cantilever fashion starting from respective opposite sides towards the opening; said fixing members being partially arranged on said appendages.

10. The apparatus according to claim 1, wherein it only comprises two single bodies one of which is defined by the support and the other by the electronic device.

11. The apparatus according to claim 1, wherein the rear surface of the electronic display device is substantially flat.

12. The apparatus according to claim 1, wherein the electronic display device has surface dimensions greater than or equal to the surface dimensions of the support.

13. The apparatus according to claim 1, wherein said lighting areas comprise a plurality of lighting elements distributed around each lighting area.

14. The apparatus according to claim 13, wherein each lighting area is defined by respective holes afforded on the electronic card; said lighting devices being arranged on a rear surface of the electronic card opposite the front surface facing the screen.

15. The apparatus according to claim 1, wherein said reversible connection means comprises members for hanging the electronic display device on the support and fixing elements.

16. The apparatus according to claim 15, wherein said fixing elements extend through the thickness dimension of the electronic display device.

17. The apparatus according to claim 16, wherein the hanging members are arranged at one side of the support that is opposite one side at which the fixing elements are arranged.

18. A wall kit comprising an apparatus according to claim 1 and a wall box inserted inside said cavity; said wall box comprising members for connection to the support and said fixing members for fixing the support being arranged at said connecting members for fixing the support to said wall box.

19. A method for installing an apparatus for controlling utilities that can be installed at an internal cavity of a wall in which the electrical connection cables to said utilities are present, wherein said method comprises the following steps:
   providing a wall support having a through opening for realizing a connection from and to said electrical cables;
   superposing said support with an access mouth of said cavity and fixing the support to the cavity through a fixing means;
   providing an electronic display device for displaying graphical symbols and mounting it on the support through a reversible connection means in which said electronic device extends completely outside the cavity;
   wherein the step of providing the support envisages the fixing means for fixing said support being configured to fix said support in at least two different fixing positions and displaced with respect to said cavity;
   said steps of superposing the support with the cavity envisage displacing the support with respect to the cavity so that the surface dimensions of said electronic device, after being mounted on said support, cover said mouth according to the shape and size of said cavity;
   said step of fixing the support to the cavity envisages using the fixing position corresponding to the superposing position of the support on the cavity, said step of providing said electronic display device comprising a sub-step of realizing a display screen facing the outside and having a surface area such as to define an outer perimeter edge of the apparatus; and wherein said step of providing an electronic display device comprises sub steps of:

arranging an electronic card behind the screen towards the support to be electrically connected to the electrical cables of the internal cavity, wherein said electronic card comprising a plurality of lighting areas configured for back-lighting different portions of the screen; and positioning said front surface of the card in such a way that it abuts against the screen so as to reduce the thickness dimensions of the electronic display device.

20. The method according to claim 19, wherein the step of mounting the display device on the support envisages hanging the display device on one side of the support through hanging members and fixing the display device at an opposite side to the first one of the support.

* * * * *